United States Patent
Lee et al.

(10) Patent No.: US 7,563,477 B2
(45) Date of Patent: Jul. 21, 2009

(54) METHOD FOR FABRICATING ORGANIC ELECTROLUMINESCENT DISPLAY

(75) Inventors: Seong Taek Lee, Suwon (KR); Jang Hyuk Kwon, Suwon (KR); Tae Min Kang, Suwon (KR); Joon Young Park, Seoul (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 619 days.

(21) Appl. No.: 11/145,936

(22) Filed: Jun. 7, 2005

(65) Prior Publication Data

US 2005/0227568 A1    Oct. 13, 2005

Related U.S. Application Data

(63) Continuation of application No. 09/935,332, filed on Aug. 23, 2001, now Pat. No. 6,936,300.

(30) Foreign Application Priority Data

Aug. 24, 2000   (KR) ............................... 2000-49287

(51) Int. Cl.
*B05D 5/06* (2006.01)
*B05D 5/12* (2006.01)
(52) U.S. Cl. .......................... 427/66; 427/68; 427/555; 427/596; 430/4; 430/7; 430/199; 430/200
(58) Field of Classification Search ............ 427/64–68, 427/58, 77, 595–596; 430/4, 7, 199, 200, 430/945
See application file for complete search history.

(56) References Cited

U.S. PATENT DOCUMENTS

| | | | |
|---|---|---|---|
| 4,819,033 A | 4/1989 | Yoshitake et al. | |
| 5,290,280 A | 3/1994 | Daikuzono | |
| 5,688,551 A | 11/1997 | Littman et al. | |
| 5,990,924 A | 11/1999 | Kido et al. | |
| 6,048,573 A * | 4/2000 | Tang et al. | 427/66 |
| 6,097,147 A | 8/2000 | Baldo et al. | |
| 6,114,088 A | 9/2000 | Wolk et al. | |

(Continued)

FOREIGN PATENT DOCUMENTS

EP    0 851 714    7/1998

(Continued)

OTHER PUBLICATIONS

Office Action issued on Jul. 18, 2008 in corresponding U.S. Appl. No. 11/211,706, which shares the samr priority application (Korean Patent Application No. 10-2000-0049287) as the subject U.S. Patent Application.

*Primary Examiner*—Michael Kornakov
*Assistant Examiner*—Francis P Smith
(74) *Attorney, Agent, or Firm*—Stein McEwen, LLP

(57) ABSTRACT

In a method for fabricating an organic electroluminescent display, a first electrode layer is formed on a transparent substrate, and a hole transport layer is formed on the first electrode layer. After an organic luminescent layer is formed on the hole transport layer by scanning a donor film disposed on the substrate using a laser beam, the donor film is removed and then a second electrode is formed on the organic luminescent layer. The laser beam dithers while performing the scanning operation to make the energy distribution uniform.

18 Claims, 8 Drawing Sheets

U.S. PATENT DOCUMENTS

| | | |
|---|---|---|
| 6,137,631 A | 10/2000 | Moulin |
| 6,242,140 B1 | 6/2001 | Kwon et al. |
| 6,358,664 B1 | 3/2002 | Nirmal et al. |
| 6,420,031 B1 * | 7/2002 | Parthasarathy et al. ... 428/411.1 |
| 2001/0004469 A1 | 6/2001 | Himeshima et al. |

FOREIGN PATENT DOCUMENTS

| | | |
|---|---|---|
| KR | 1998-84557 | 12/1998 |
| KR | 2000-20873 | 4/2000 |

* cited by examiner

METHOD FOR FABRICATING ORGANIC ELECTROLUMINESCENT DISPLAY

CROSS-REFERENCE TO RELATED APPLICATION

This application is a continuation of U.S. patent application Ser. No. 09/935,332, filed Aug. 23, 2001, now U.S. Pat. No. 6,936,300 and claims the benefit of Korean application No. 2000-49287 filed in the Korean Intellectual Property Office on Aug. 24, 2000, the disclosures of which are incorporated herein by reference.

BACKGROUND OF THE INVENTION

1. Field of the Invention

The present invention relates to a method for fabricating an organic electroluminescent display that can improve the definition of an image at the edges of a pattern.

2. Description of the Related Art

An electroluminescent display is designed to realize an image by exciting an electroluminescent material disposed between electrodes by applying a voltage to the electrodes. Such an electroluminescent display is classified into an inorganic electroluminescent display and an organic electroluminescent display according to the electroluminescent material. The former is widely used for a backlight of a watch, while the latter is developed as a display as it advantages in that it can be driven with a low voltage and has a high responsiveness and polychrome.

Generally, such an organic electroluminescent display comprises a transparent substrate, an anode electrode formed on the substrate, an organic luminescent layer covering the anode electrode, and a cathode electrode formed on the organic luminescent layer.

The organic luminescent layer may have a variety of structures according to an electroluminescent material. For example, the organic luminescent layer may be formed of a hole transport layer, an luminescent layer, and an electron transport layer.

In the above described organic electroluminescent display, the organic luminescent layer is designed to realize red (R), green (G), and blue (B) colors so that it can be applied to a color display.

Such an organic luminescent layer is generally formed through a well-known vacuum evaporative deposition process or optical etching process. However, the vacuum evaporative deposition process has a limitation in reducing the physical gap between the patterns and it is difficult to form a minute pattern to tens of μm level which is required against the possible deformation of the mask. When the optical etching process is applied, although it is possible to form the minute pattern, the property of the luminescent material forming the organic luminescent layer may be deteriorated by the developing solution or the etching solution.

Therefore, in recent years, a thermal transferring method that is a kind of dry etching processes has been proposed to form the organic luminescent layer.

The thermal transferring method converts light emitted from a light source into thermal energy by which an image formation material is transferred to a substrate to form the organic luminescent layer. Therefore, to perform the thermal transferring method, a light source, a donor film and a substrate are required.

Describing the thermal transferring method more in detail, when light is emitted from a light source such as a laser unit to a donor film, the light is converted into thermal energy by a light absorption material of the donor film. The thermal energy allows the luminescent material of the donor film to be transferred to the surface of the substrate to form the organic luminescent layer.

That is, the organic luminescent layer is formed by scan laser beam to the door film disposed on the substrate. The focus of the laser beam is adjusted to a predetermined value, on the donor film disposed the substrate.

U.S. Pat. No. 5,521,035 discloses a method for fabricating a color filter for a liquid crystal display through a laser thermal transferring process.

In the patent, the color filter is fabricated by a laser induction thermal transferring process for transferring a color material from a donor film to a substrate such as a glass or a polymeric film. As a laser unit, an Nd:YAG laser system may be used. This will be described with reference to FIG. 1.

As shown in FIG. 1, the Nd:YAG laser is designed to form a Gaussian beam B1 shaped in a Gaussian functional distribution. When a diameter of the Gaussian beam B1 is set above 60 μm, the inclination of the energy distribution is reduced as it goes away from the center point O.

Accordingly, as shown in FIG. 2, when the organic luminescent layer is formed by the scanning operation of the Gaussian beam B1 having a predetermined diameter in an X-direction, since the beam intensity is low at the both edges 20 of the organic luminescent layer, the image quality at the both edges 20 is deteriorated when compared with the central portion.

When the energy of the laser beam is intensified to improve the image quality at the edges 20, since the energy is excessively increased at the central portion, the surface of the image pattern becomes irregular.

When the laser thermal transferring method is used to form the color filter, a transfer material (color material) is formed of a binder polymer and pigment inducing color change and dispersed in the binder polymer (acrylic acid resin or epoxy resin) at a ratio of 20-40%. The binder polymer simply functions for transmitting light. Therefore, to form a desire color pattern, a kind of binder polymer, a Tg (Glass Transmission Temperature) value or a molecular weight of the binder polymer should be properly modified.

Conventionally, the color material has a Tg value of about 60-120° C. and a molecular weight of about 1,500-5,000. The color layer formed by the color material has a thickness of about 1-2 μm.

When the laser thermal transferring method is used to form the organic electroluminescent display, the property (purity, Tg value, molecular weight and the like) of the transfer material (luminescent material) highly affects on the quality of the device. Therefore, when an inappropriate material is added, the quality of the device may suffer deathblow. Therefore, it is preferable to adjust the pattern quality by adjusting the laser transferring condition rather than modifying the property of the luminescent material.

Since the luminescent material used for the organic electroluminescent display has a molecular weight above 10,000 and a Tg value above 100° C., it is relatively difficult to perform the process for forming the organic luminescent layer when compared with the process for forming the color layer. The thickness of the organic luminescent layer which should be realized through the laser thermal transferring method should be 50-100 nm which is less than that of the color layer of the color filter.

Therefore, to form such a thin organic luminescent layer, scrupulous care in setting a laser beam transferring condition and an energy distribution is further required.

SUMMARY OF THE INVENTION

It is an objective of the present invention to provide a method for fabricating an organic electroluminescent display having an improved pattern quality.

To achieve the above objective, the present invention provides a method for fabricating an organic electroluminescent display, comprising the steps of forming a first electrode layer on a transparent substrate; forming an assistant layer on the first electrode layer; forming an organic luminescent layer on the assistant layer by scanning a donor film disposed on the substrate using a laser beam; removing the donor film; and forming a second electrode on the organic luminescent layer.

The step of forming an organic luminescent layer further comprises the step of allowing the laser beam to dither with respect to an advancing direction of the laser beam.

The laser beam is radiated from a single laser unit and splitted into more than two splitted laser beams, the splitted laser beams being synchronized to simultaneously scan adjacent corresponding patterns.

Alternatively, the laser beam is formed of at least two laser beams which are radiated from at least two laser units and overlapped one another, the laser beams radiated from the laser units having an identical energy distribution.

Alternatively, the laser beam is formed of at least two laser beams radiated from at least two laser units and performing the scanning operation at a different phase. The laser beams are synchronized to simultaneously scan adjacent corresponding patterns.

A dithering speed of the laser beam is higher than an advancing speed of the laser beam.

Preferably, the dithering speed of the laser beam is about 100-1000 kHz.

Preferably, the laser beam performs the dithering operation while making one of a frequency wave selected from the group consisting of a sine-wave, a sawtooth-wave, a trapezoid-wave, or a modified sine-wave.

The laser beam has a section formed in an oval-shape having a longitudinal diameter greater than a lateral diameter, the longitudinal diameter is formed in a scan direction.

Preferably, the longitudinal diameter is about 200-500 μm and the lateral diameter is about 15-50 μm.

Preferably, wherein the organic luminescent layer is formed of a poly phenylene vinylene (PPV)-based material or poly fluorine (PF)-based material.

According to another aspect, the laser beam is a complex laser beam formed by mixing a first laser beam having a smooth inclination at a Pe'(peak of energy of the first laser beam)/2 and second laser beams having a steep inclination at a Pe" (peak of energy of the second laser beams)/2.

Preferably, the complex laser beam has an inclination above 2%/μm at a Pe(peak of energy of the complex laser beam)/2.

Preferably, a section of the complex laser beam is formed in oval-shape.

Preferably, the complex laser beam has power of about 8 W (Watt) and an advancing speed of about 5~11 m/sec.

Additional aspects and/or advantages of the invention will be set forth in part in the description which follows and, in part, will be obvious from the description, or may be learned by practice of the invention.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

Preferred embodiments of the present invention will be described in detail with reference to the accompanying drawings.

Figure 3:
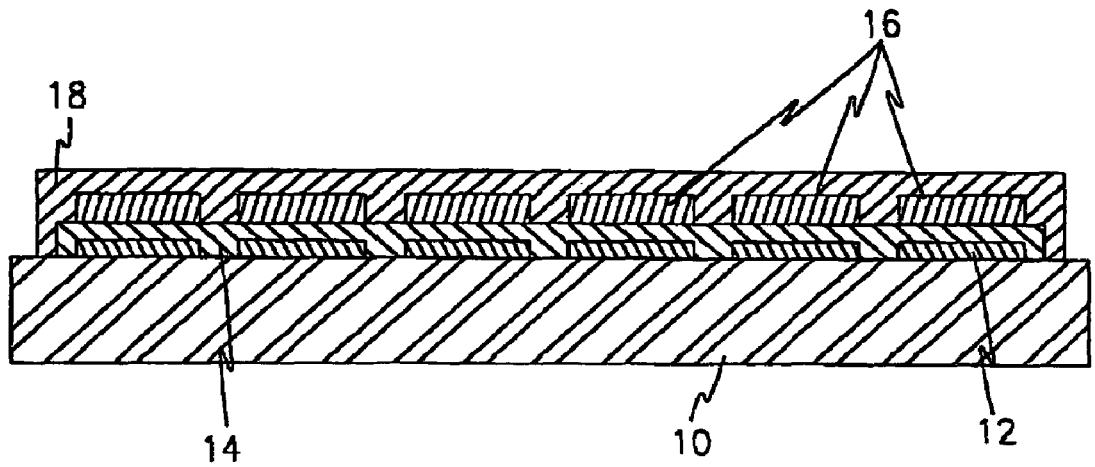
FIG. 3 is a schematic view for illustrating an organic electroluminescent display fabricated under the present invention.
Figure 4:
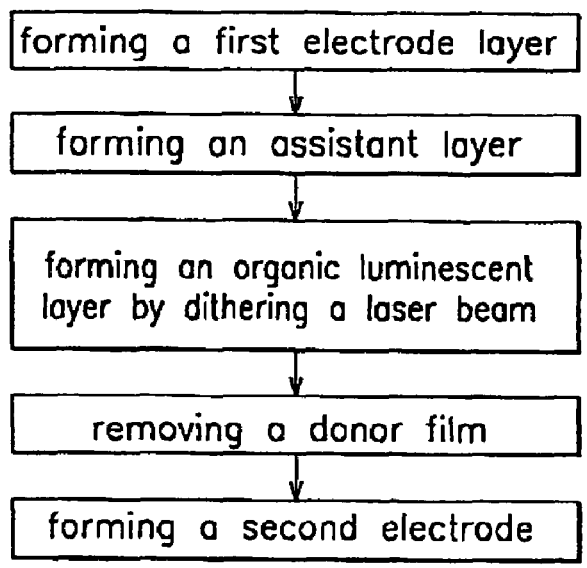
FIG. 4 is a block diagram for illustrating a method for fabricating an organic electroluminescent display according to a first embodiment of the present invention.

FIG. 3 shows an organic electroluminescent display fabricated under the present invention, and FIG. 4 shows a method for fabricating an organic electroluminescent display according to a first embodiment of the present invention.

As shown in the drawings, a first electrode layer 12 having a thickness of about 100-500 nm is formed on a transparent substrate 10 by sputtering ITO (Indium Tin Oxide).

An assistant layer (hole transport layer) 14 having a thickness of about 10-100 nm is formed on the first electrode layer 12 by, for example, a spin coating process, a dip coating process, a vacuum evaporative deposition process, or a thermal transferring process. An R. G. B organic luminescent layer 16 is formed on the assistant layer (hole transport layer) 14 by a thermal transferring process according to a feature of the present invention. A second electrode layer 18 intersecting the first electrode layer at right angles is formed on the organic luminescent layer 16.

Preferably, the second electrode layer 18 is formed by depositing aluminum through a vacuum evaporative deposition process at a thickness of about 50-1500 nm. An insulating layer formed of an organic material such as polymer photoresist or an inorganic material such as SiO2 and SiN2 may be deposited between the line patterns of the first electrode.

In addition, a material such as LiF, Ca, or Ba may be disposed between the organic luminescent layer and the second electrode layer.

Preferably, the organic luminescent layer 16 is formed of a poly phenylene vinylene (PPV)-based material or poly fluorine (PF)-based material.

Figure 5:
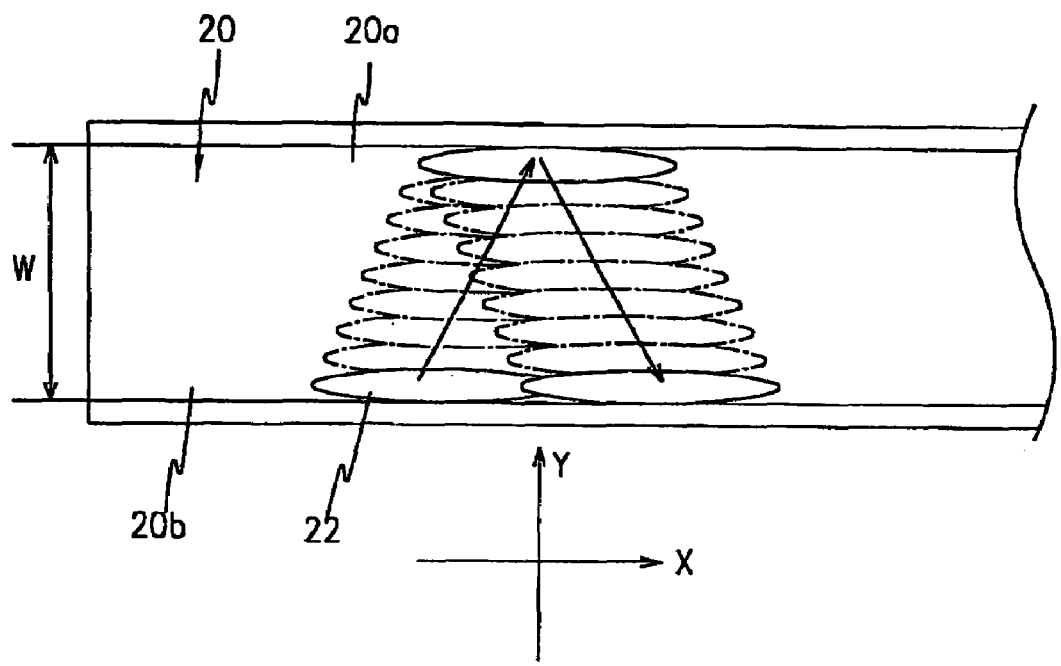
FIG. 5 is a schematic view for illustrating a laser thermal transferring method described with reference to FIG. 4.

FIG. 5 shows a schematic view for illustrating a laser thermal transferring method described with reference to FIG. 4.

In the drawing, the reference numeral 22 indicates a laser beam for scanning a pattern 20.

The laser beam 22 moves from left to right in the drawing (i.e., in an X-direction) along the pattern 20 to perform the scanning process. At this point, while moving in the X-direction, the laser beam 22 dithers in a Y-direction.

By the dithering movement of the laser beam 22, the thermal transferring process is effectively realized even at both edges 20a and 20b of the pattern 20. The dithering movement is realized by alternating the advancing direction of the laser beam under the control of an acousto-optic modulator (AOM).

In addition, the dithering speed (i.e., a moving speed in the Y-direction) is preferably higher than the advancing speed (i.e., an advancing speed in the X-direction). That is, considering the advancing speed and the energy distribution, it is preferable to set the dithering speed at about 100-10,000 KHz.

Although the section of the laser beam may be formed in a circular-shape, but it is more preferable to be formed in an oval-shape. Particularly, as shown in the drawing, the section of the oval-shaped laser beam 22 is designed such that a diameter in a direction of an X-axis (in the advancing direction) is greater that a diameter in a direction of a Y-axis (in the dithering direction). Therefore, when the scanning is performed, the overlap ratio of the laser beams is increased, whereby the energy distribution is uniformly applied to the entire portion of the pattern 20.

When the lateral width W of the pattern 20 is 60-150 μm, it is preferable that the section of the laser beam is oval-shaped having the X-axis diameter of 200-500 μm and the Y-axis diameter of 15-50 μm.

Figure 6:
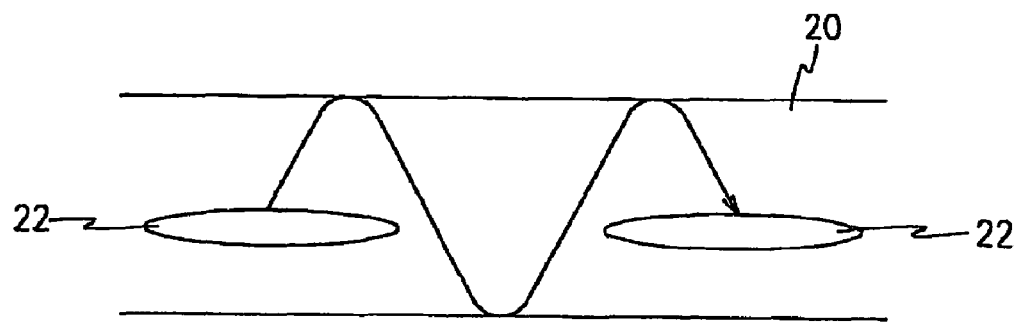
FIGS. 6 to 8 are schematic views for illustrating dithering examples of a laser beam depicted in FIG. 5.
Figure 7:
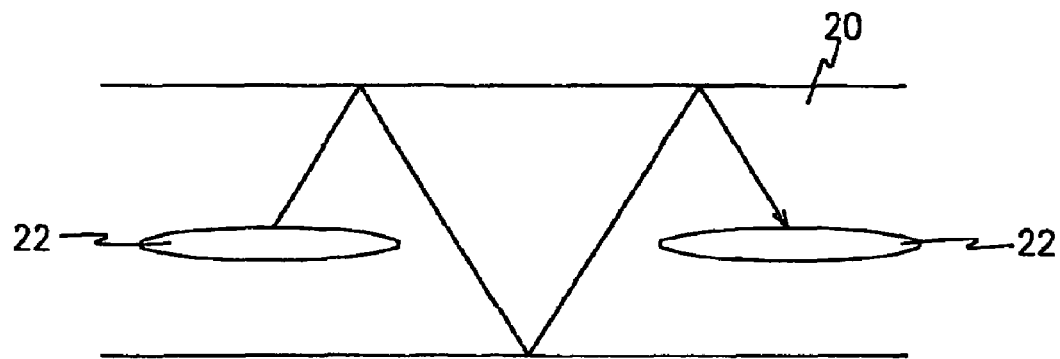
Figure 8:
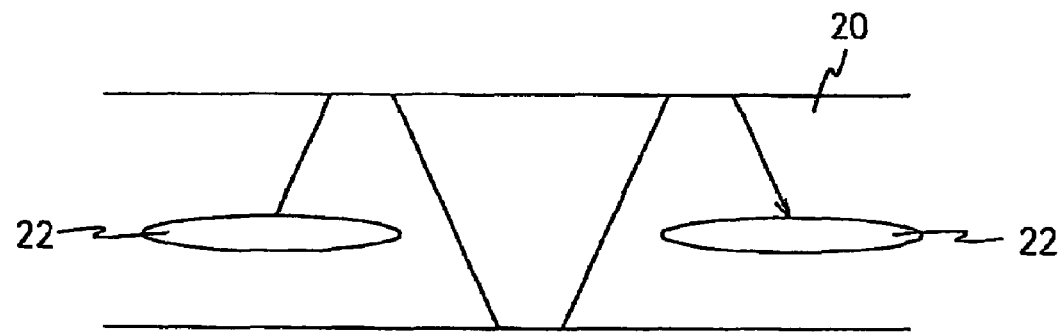

As shown in FIGS. 6 to 8, the laser beam performs its scanning operation while making a sine-wave (see FIG. 6), a sawtooth-wave (see FIG. 7), a trapezoid-wave (see FIG. 8), or a modified sine-wave (not shown). At this point, the sectional energy distribution of the laser beam 22 is as shown in FIG. 9.

Figure 9:
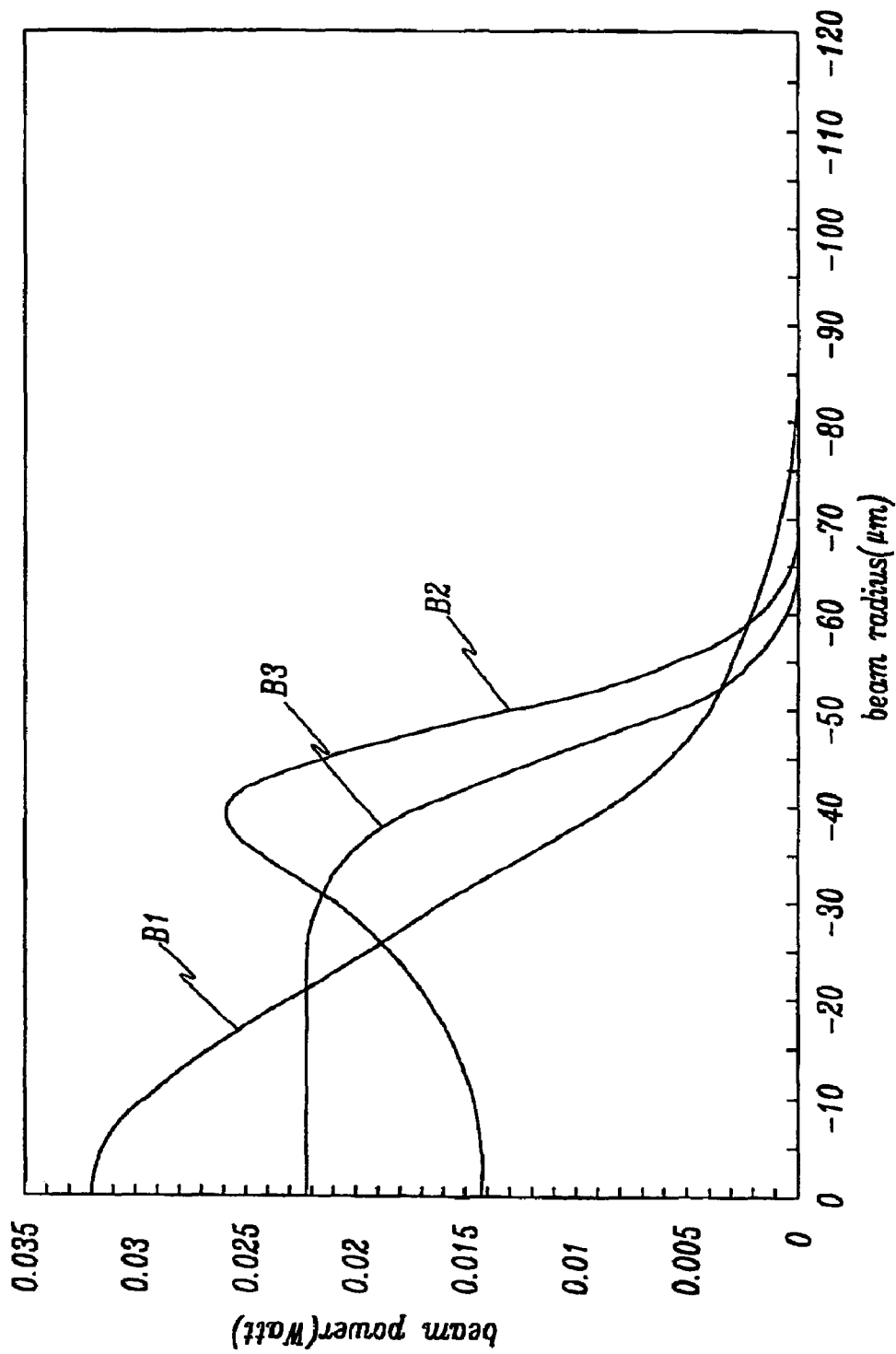
FIG. 9 is a graph for illustrating a sectional energy distribution of a laser beam used for a thermal transferring method that can be employed to the first embodiment of the present invention.

As shown in FIG. 9, when the laser beam performs its scanning operating without the dithering movement, the laser beam (i.e., Gaussian beam B1) has an energy distribution having an inclination reduced as it goes from the central portion to the edges of the pattern.

However, the laser beam 22 of the present invention has an energy distribution having an inclination steeply increased as it goes from the central portion to the edges of the pattern (See graphs B2 and B3 in FIG. 9 which respectively represent the laser beams performing their dithering movements in the shape of the sine-wave and the trapezoid-wave).

As described above, the intensity of the laser beam 22 of the present invention is not reduced even at the edges 20a and 20b of the pattern 20, thereby effectively realizing the thermal transferring process. That is, as in the conventional laser beam B1, when the beam intensity is increased to compensate for the intensity of the beam edge, the surface of the pattern becomes uneven. However, the laser beam of the present invention has the beam intensity throughout its entire area, there is no need to increase the beam intensity to compensate for the beam edge. As a result, the flatness of the pattern can be improved.

In the above-described first embodiment, a single laser beam is radiated from a single laser unit. However, the present invention is not limited to this.

Figure 10:
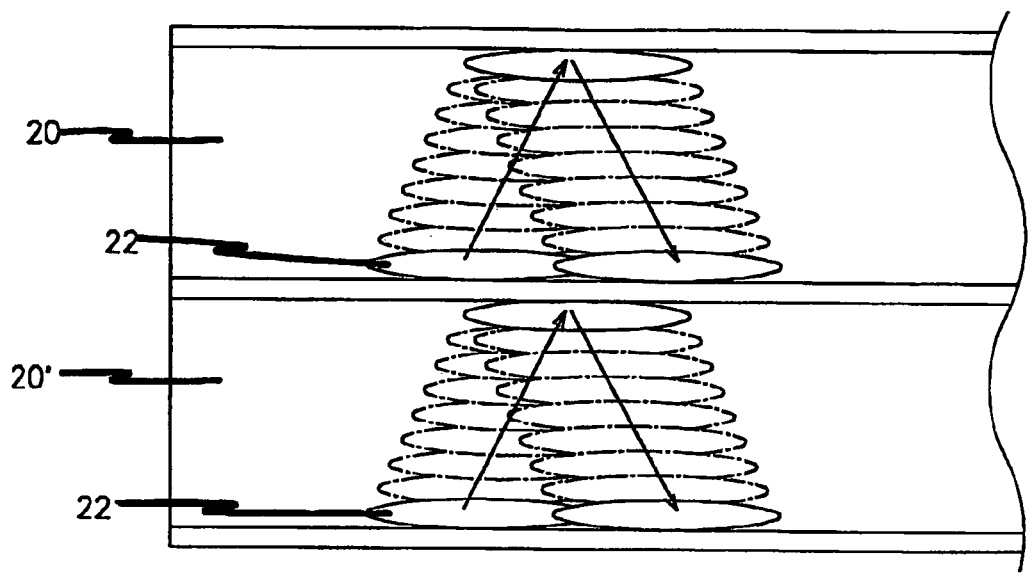
FIG. 10 is a schematic view for illustrating a first modified example of a laser thermal transferring method that can be employed to the first embodiment of the present invention.

That is, as shown in FIG. 10, plural split laser beams 22 and 22' may be radiated from a single laser unit (not shown) so that plural organic luminescent layer patterns 20 and 20' are simultaneously scanned. Preferably, the plural split laser beams are synchronized. This allows the process time to be saved.

Figure 11:
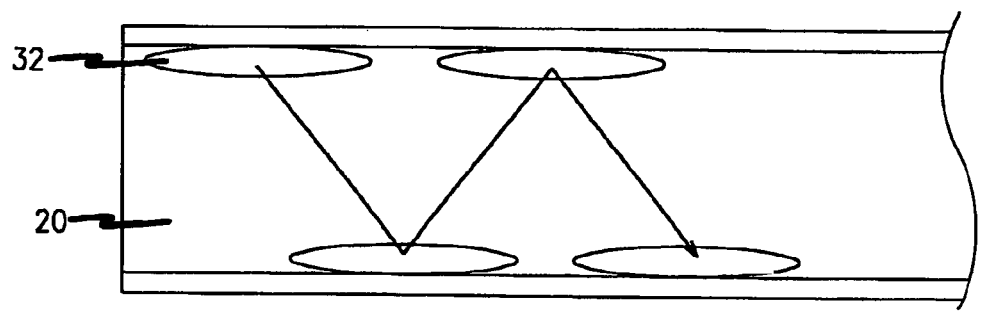
FIG. 11 is a schematic view for illustrating a second modified example of a thermal transferring method that can be employed to the first embodiment of the present invention.

Alternatively, as shown in FIG. 11, plural laser beams radiated from plural laser units are overlapped one another to form a single overlapped laser beam 32. As more than two laser beams are overlapped, the beam intensity is increased, reducing the scanning time.

Figure 12:
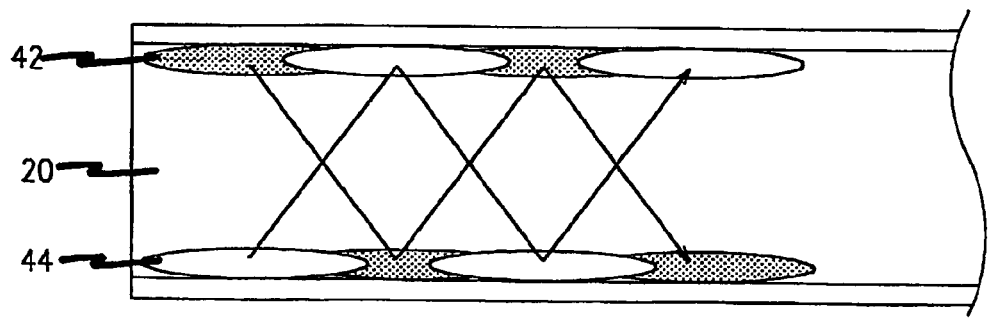
FIG. 12 is a schematic view for illustrating a third modified example of a laser thermal transferring method that can be employed to the first embodiment of the present invention.

Alternatively, as shown in FIG. 12, plural laser beams 42 and 44 are radiated from plural laser units (not shown) and perform the scanning operation with different phases.

Figure 13:
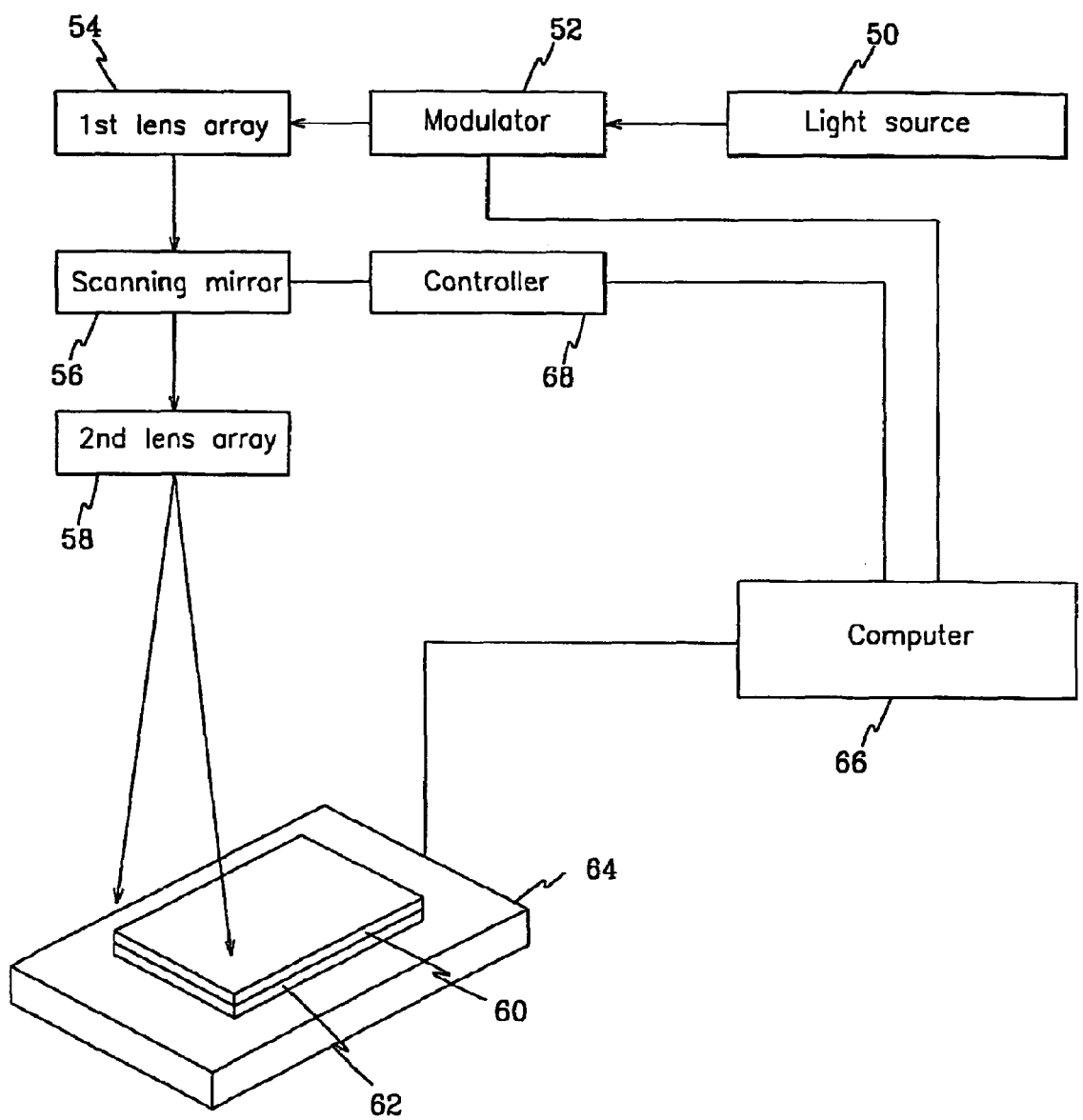
FIG. 13 is a schematic view for illustrating a transferring apparatus for realizing the first embodiment of the present invention.

FIG. 13 shows a thermal transferring apparatus for realizing the above-described thermal transferring methods.

A light source 50 radiates a solid laser beam such as ND/YAG or a gas laser beam such as $CO_2$ laser.

As described above, the radiated laser beam may be the single laser beam or the split laser beams or the single overlapped laser beam. The split laser beams may be advanced in an overlapped state or in different phases.

The laser beam (i.e., the single laser beam or the split laser beams or the single overlapped laser beam) radiated from the light source 50 is adjusted in its intensity by a modulator 52 and then reach a scanning mirror 56 via a first lens array 54.

The scanning mirror 56 guides the laser beam path to the target on the substrate.

The laser beam reached the scanning mirror 56 is emitted to the donor film 60, on which a luminescent material is deposited, via a second lens array 58. Then, only a portion of the donor film 60, which is scanned by the laser beam, is transferred to the substrate 62.

The donor film 60 and the substrate 62 are supported on a stage 64 whose movement is controlled by a computer 66. The computer 66 also controls the scanning mirror 56 through a scanning mirror controller 68.

The dithering movement of the laser beam is controlled by the modulator 52 which is controlled by the computer 66.

Figure 14:
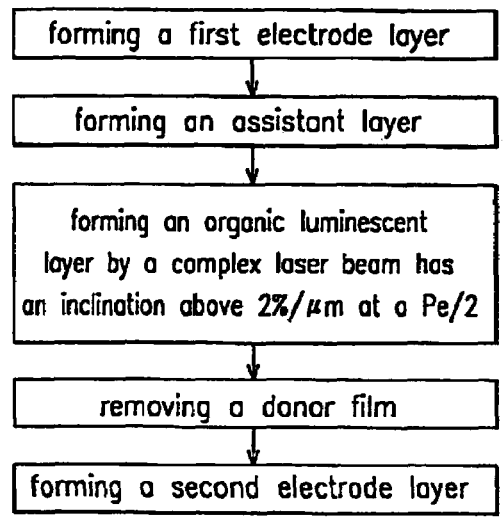
FIG. 14 is a block diagram for illustrating a method for fabricating an organic electroluminescent display according to a second embodiment of the present invention.
Figure 15:
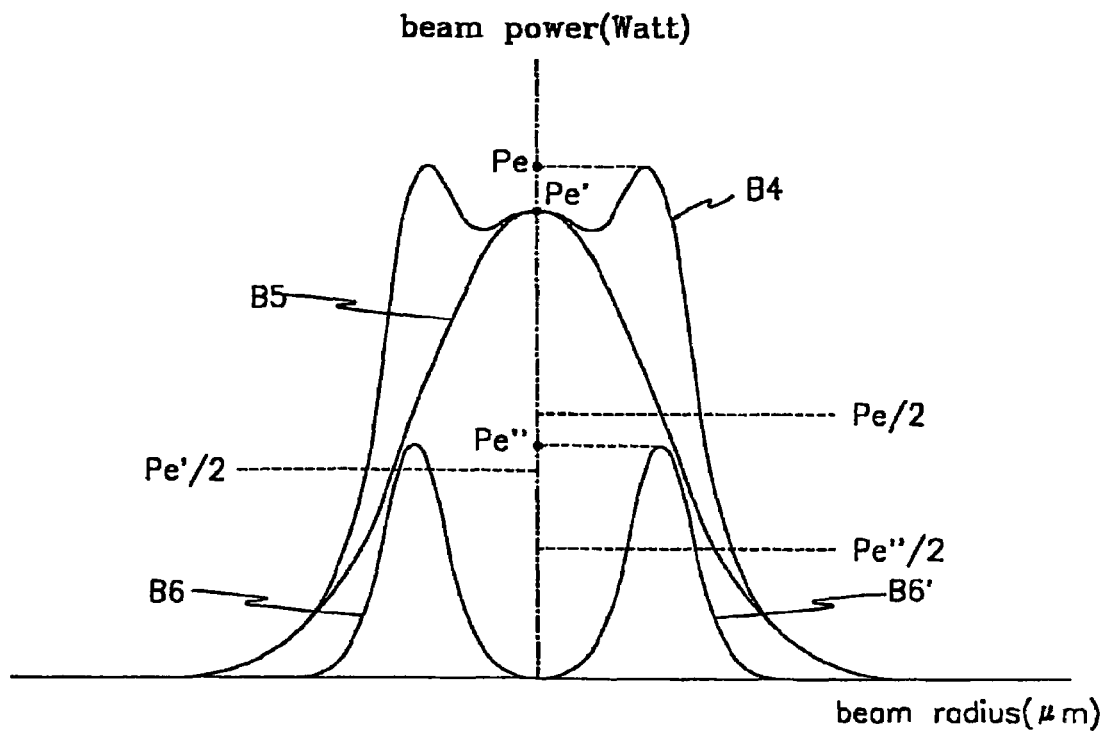
FIG. 15 is a graph for illustrating a sectional energy distribution of a laser beam applied to the second embodiment.

In the above modified examples, the laser beams are dithered various type. However, the present invention is not limited to this. As shown in FIGS. 14 and 15, plural laser beams having a different energy distribution from each other may be mixed. That is, a complex laser beam B4 may be formed by mixing a laser beam B5 having a smooth inclination at the Pe' (peak of energy of the laser beam B5)/2 and laser beams B6 and B6' having a steep inclination at the Pe" (peak of energy of the laser beams B6 AND B6')/2.

As the laser beam B5, laser beam having an inclination of about 1.0-6.0%/μm at the Pe'/2 and a lateral diameter of about 40-200 μm is preferably used, and as the laser beams B6 and B6', laser having an inclination of about 3~8%/μm at the Pe"/2 and a lateral diameter of about 30~75 μm is preferably used.

Figure 1:
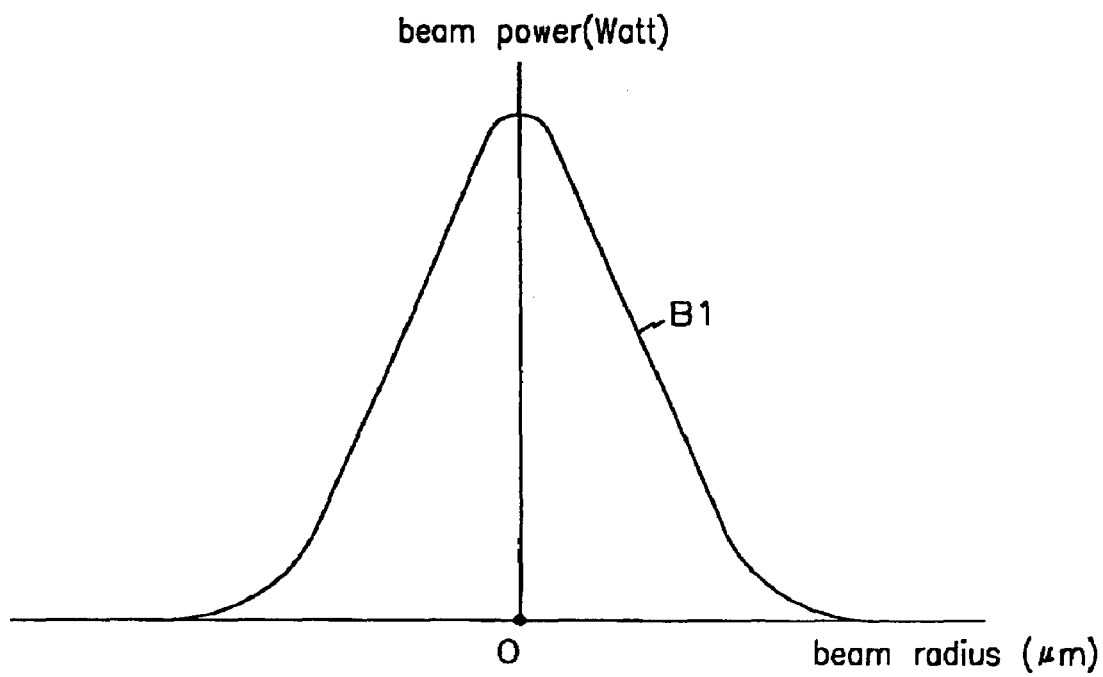
FIG. 1 is a graph for illustrating an energy distribution of a laser beam used for a conventional thermal transferring method.
Figure 2:
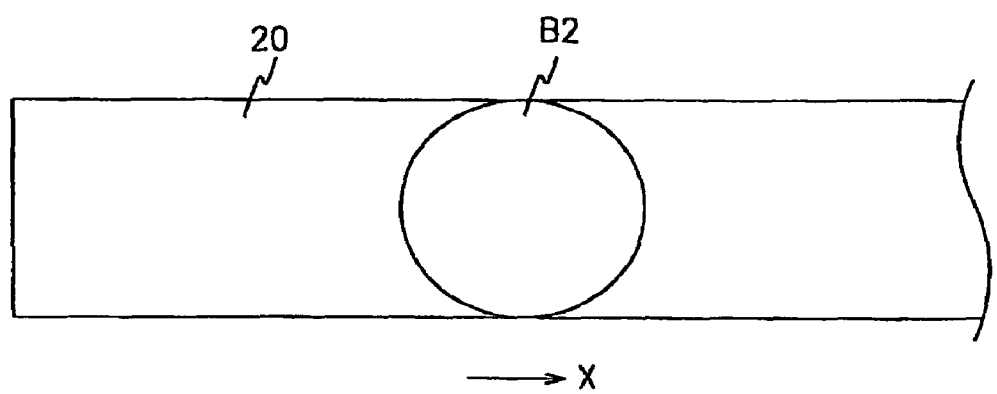
FIG. 2 is a schematic view for illustrating a method for forming a pattern using a conventional thermal transferring method.

Accordingly, the complex laser beam B4 has an inclination of the energy distribution above 2.0%/μm at the Pe/2. This shows that the inclination of the complex laser beam is greater than that of the Gaussian beam (B1 in FIG. 1).

The Gaussian beam has an inclination of about 1.4%/μm at the peak of energy/2.

The complex laser beam B4 has a section formed in an oval-shape having a longitudinal diameter greater than a lateral diameter, the longitudinal diameter is formed in a scan direction, and power of about 8 W (Watt) and an advancing speed of about 5~11 m/sec.

As describe above, the laser beam (i.e., Gaussian beam B1) has an energy distribution having a smooth inclination as it goes from the central portion to the edges of the pattern, while the complex laser beam B4 of the present invention has an energy distribution having a steep inclination as it goes from the central portion to the edges of the pattern. That is, the intensity of the complex laser beam B4 is not reduced even at the edges 20a and 20b of the pattern 20, thereby effectively realizing the thermal transferring process. That is, as in the conventional laser beam B1, when the beam intensity is increased to compensate for the intensity of the beam edge, the surface of the pattern becomes uneven. However, the complex laser beam B4 of the present invention has the beam intensity through out its entire area, there is no need to increase the beam intensity to compensate for the beam edge. As a result, the flatness of the pattern can be improved.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A method for fabricating an organic electroluminescent display, comprising:
   forming a first electrode layer on a transparent substrate;
   forming an organic luminescent layer on the first electrode layer by scanning a donor film disposed on the substrate using a laser beam and allowing the laser beam to dither with respect to an advancing direction of the laser beam;
   removing the donor film; and
   forming a second electrode layer on the organic luminescent layer,
   wherein the organic luminescent layer is formed of a poly phenylene vinylene (PPV)-based material or a poly fluorine (PF)-based material and the laser beam is a complex laser beam having an energy distribution inclination above 2.0%/µm at a peak of energy of the complex laser beam (Pe)/2.

2. The method of claim 1, wherein the laser beam is radiated from a single laser unit.

3. The method of claim 1, wherein the laser beam is radiated from a single laser unit and splitted into more than two splitted laser beams, the splitted laser beams being synchronized to simultaneously dither adjacent corresponding patterns.

4. The method of claim 1, wherein the laser beam is formed of at least two laser beams which are radiated from at least two laser units and overlapped one another, the laser beams radiated from the laser units having an identical energy distribution.

5. The method of claim 1, wherein the laser beam is formed of at least two laser beams radiated from at least two laser units and performing the scanning operation at a different phase.

6. The method of claim 1, wherein the laser beam is formed of at least two laser beams radiated from at least two laser units and the laser beams being synchronized to simultaneously scan adjacent corresponding patterns.

7. The method of claim 1, wherein a dithering speed of the laser beam is higher than an advancing speed of the laser beam.

8. The method of claim 7, wherein the dithering speed of the laser beam is about 100-1000 kHz.

9. The method of claim 1, wherein the laser beam performs the scanning operation while making one of a frequency wave selected from the group consisting of a sine-wave, a sawtooth-wave, a trapezoid-wave or a modified sine-wave.

10. The method of claim 1, wherein the laser beam has a section formed in an oval-shape having a longitudinal diameter greater than a lateral diameter, the longitudinal diameter is formed in a scan direction.

11. The method of claim 10, wherein the longitudinal diameter is about 200-500 µm and the lateral diameter is about 15-50 µm.

12. A method for fabricating an organic electroluminescent display, comprising:
   forming a first electrode layer on a transparent substrate;
   forming an assistant layer on the first electrode layer;
   forming an organic luminescent layer on the first electrode layer by scanning a donor film disposed on the substrate using a laser beam;
   removing the donor film; and
   forming a second electrode layer on the organic luminescent layer,
   wherein the laser beam is a complex laser beam having an energy distribution inclination above 2.0/µm at a peak of energy of the complex laser beam (Pe)/2.

13. The method of claim 12, wherein the complex laser beam is formed by mixing a first laser beam having a first energy distribution inclination at a peak of energy of the first laser beam (Pe')/2 and second laser beams having second energy distribution inclinations at peaks of energy of the second laser beams (Pe")/2, wherein the second energy distribution inclinations of the second laser beams are greater than the first energy distribution inclination of the first laser beam.

14. The method of claim 12, wherein the complex laser beam has a section formed in an oval-shape having a longitudinal diameter greater than a lateral diameter, the longitudinal diameter is formed in a scan direction.

15. The method of claim 14, wherein the second energy distribution inclinations of the second laser beams have an inclination of about 3.0-8.0%/µm at the Pe"/2 and a lateral diameter of about 30-75 µm.

16. The method of claim 14, wherein the first energy distribution inclination of the first laser beam has an inclination of about 1.0-6.0%/µm at the Pe'/2 and a lateral diameter of about 40-200 µm.

17. A method for fabricating an organic electroluminescent display, comprising:
   forming a first electrode layer on a transparent substrate;
   forming an organic luminescent layer on the first electrode layer by scanning a donor film disposed on the substrate using a laser beam and allowing the laser beam to dither with respect to an advancing direction of the laser beam;
   removing the donor film; and
   forming a second electrode layer on the organic luminescent layer,
   wherein the organic luminescent layer is formed of a poly phenylene vinylene (PPV)-based material or a poly fluorine (PF)-based material, and the laser beam is a complex laser beam formed by mixing a plurality of laser beams having different energy distributions.

18. A method for fabricating an organic electroluminescent display, comprising:

forming a first electrode layer on a transparent substrate;
forming an assistant layer on the first electrode layer;
forming an organic luminescent layer on the first electrode layer by scanning a donor film disposed on the substrate using a laser beam;
removing the donor film; and
forming a second electrode layer on the organic luminescent layer,
wherein the laser beam is a complex laser beam formed by mixing a plurality of lasers beams having different energy distributions.

* * * * *

UNITED STATES PATENT AND TRADEMARK OFFICE
CERTIFICATE OF CORRECTION

PATENT NO. : 7,563,477 B2 Page 1 of 1
APPLICATION NO. : 11/145936
DATED : July 21, 2009
INVENTOR(S) : Seong-Taek Lee et al.

It is certified that error appears in the above-identified patent and that said Letters Patent is hereby corrected as shown below:

Column 8, line 28, change "2.0/μm" to --2.0%/μm--.

Signed and Sealed this

Tenth Day of November, 2009

David J. Kappos
*Director of the United States Patent and Trademark Office*